(12) United States Patent
Painter et al.

(10) Patent No.: US 7,977,573 B1
(45) Date of Patent: Jul. 12, 2011

(54) SOLDERLESS CABLE-IN-CONDUIT-CONDUCTOR (CICC) JOINT

(75) Inventors: Thomas A. Painter, Tallahassee, FL (US); Ting Xu, Tallahassee, FL (US); Scott Bole, Tallahassee, FL (US); Todd Adkins, Tallahassee, FL (US)

(73) Assignee: Florida State University, Tallahassee, FL (US)

( * ) Notice: Subject to any disclaimer, the term of this patent is extended or adjusted under 35 U.S.C. 154(b) by 141 days.

(21) Appl. No.: 12/542,308

(22) Filed: Aug. 17, 2009

Related U.S. Application Data

(60) Provisional application No. 61/089,306, filed on Aug. 15, 2008.

(51) Int. Cl.
*H01R 4/02* (2006.01)

(52) U.S. Cl. ..................................... 174/88 R

(58) Field of Classification Search ............... 174/88 R, 174/84 C, 125.1; 505/230, 231, 232
See application file for complete search history.

(56) References Cited

U.S. PATENT DOCUMENTS

| | | | |
|---|---|---|---|
| 7,152,302 B2 * | 12/2006 | Morita et al. | 29/599 |
| 2011/0028327 A1 * | 2/2011 | Kodama et al. | 505/211 |

* cited by examiner

*Primary Examiner* — Chau N Nguyen
(74) *Attorney, Agent, or Firm* — Ronald E. Smith; Smith & Hopen, P.A.

(57) ABSTRACT

A cable-in-conduit-conductor (CICC) joint for use with a hybrid magnet. An elongate copper member is disposed in sandwiched relation between a first and second cable that are disposed in parallel, spaced apart relation to one another. A first elongate member is disposed in overlying relation to the first cable and a second elongate member is disposed in underlying relation to the second cable. All of the parts are positioned within a joint box, and the joint box is sandwiched between first and second flat plates that are interconnected to one another by elongate bolts. Tightening the bolts compresses the parts within the joint box. A heat treatment completes the solderless joint.

6 Claims, 6 Drawing Sheets

US 7,977,573 B1

SOLDERLESS CABLE-IN-CONDUIT-CONDUCTOR (CICC) JOINT

CROSS REFERENCE TO RELATED APPLICATIONS

This application claims priority to currently pending U.S. Provisional Patent Application 61/089,306, entitled SOLDER-LESS CABLE-IN-CONDUIT-CONDUCTOR (CICC) JOINT, filed Aug. 15, 2008, by the same inventors, the contents of which are herein incorporated by reference.

GOVERNMENT SUPPORT CLAUSE

This invention was made with Government support under Grant No. DMR-0603042 awarded by the National Science Foundation. The Government has certain rights in the invention.

BACKGROUND OF THE INVENTION

1. Field of the Invention

This invention relates to the field of hybrid magnetics. More particularly, it relates to an improved joint for joining superconducting cables to one another.

2. Description of the Prior Art

Conventional cable-in-conduit-conductor (CICC) joints are soldered together. They exhibit high DC resistance and can fail under the extremely low temperatures and high stresses associated with CICC superconductors.

There is a need for a robust, solderless CICC joint having low DC resistance. However, in view of the prior art considered as a whole at the time the present invention was made, it was not obvious to those of ordinary skill in the art how to improve the conventional joints.

SUMMARY OF INVENTION

The long-standing but heretofore unfulfilled need for an improved cable-in-conduit-conductor (CICC) joint for use with a hybrid magnet such as the 35-T series-connected hybrid magnet is now provided in the form of a new, useful, and nonobvious joint that is provided in a solderless, single box, praying-hands configuration having low DC resistance.

The design of the 35-T series-connected hybrid (SCH) magnet for the National High Magnetic Field Laboratory (NHMFL) includes a resistive insert and a superconducting outsert. The superconducting outsert includes three concentric layer-wound subcoils using different grades of $Nb_3Sn$ cable-in-conduit-conductors. The splices and terminals of the subcoils are placed outside the 35-T SCH (approximately 0.75 m in radius) and aligned with a magnetic axial field. The joints are in praying-hands configuration. Low magnetic field and favorable orientation minimize AC losses in the joints during magnet ramp and discharge. The cryogenic budget for each joint at normal running mode is 0.8 W, which requires the joint DC resistance to be less than two nano-Ohms (2 nΩ).

More particularly, the novel structure is a cable-in-conduit-conductor (CICC) joint for use with a hybrid magnet and includes a first cable and a second cable disposed in parallel, spaced apart relation to one another. An elongate copper member is disposed in sandwiched relation between the first and second cables and an elliptical surface is formed in opposite sides of the elongate copper member to accommodate said cables. A first elongate member is disposed in overlying relation to the first cable and a second elongate member is disposed in underlying relation to the second cable. An elliptical surface to accommodate said first and second cables is formed in said first and second elongate members, respectively.

A joint box has an open top, a closed bottom, an open end, and a hollow interior.

Each of the first and second cables has a free end disposed within a hollow interior of the joint box, entering said hollow interior through the open end.

A first flat plate is disposed in closing relation to the open top of the joint box. An elongate base member is disposed in underlying relation to the first flat plate in registration with a longitudinal axis of symmetry of the first flat plate so that the elongate base member extends into the hollow interior of the joint box when the first flat plate is positioned into overlying relation to the open top of the joint box.

Compressing means are provided for driving the first flat plate toward the bottom wall of the box so that the elongate base member bears against the first elongate member, the first elongate member bears against the first elongate cable, the first elongate cable bears against the elongate copper member, the elongate copper member bears against the second elongate cable, the second elongate cable bears against the second elongate member, and the second elongate member bears against the bottom wall of the box.

The bottom wall of the box bears against a second flat plate that is connected to the first flat plate by a plurality of elongate bolts so that tightening of said bolts drives said first and second flat plates toward one another, thereby compressing the parts disposed therebetween.

The novel method of fabricating a cable-in-conduit-conductor (CICC) joint for use with a hybrid magnet includes the steps of positioning a first cable and a second cable in parallel, spaced apart relation to one another, positioning an elongate copper member in sandwiched relation between the first and second cables, positioning a first elongate member in overlying relation to the first cable, and positioning a second elongate member in underlying relation to the second cable.

The novel method further includes the steps of providing a joint box having an open top, a closed bottom, an open end, and a hollow interior, and positioning said first elongate member, said first cable, said elongate copper member, said second cable, and said second elongate member within the hollow interior of said box so that said second elongate member overlies said bottom wall of said box.

The novel method further includes the steps of driving the first flat plate toward the second flat plate so that the elongate base member bears against the first elongate member, the first elongate member bears against the first elongate cable, the first elongate cable bears against the elongate copper member, the elongate copper member bears against the second elongate cable, the second elongate cable bears against the second elongate member, and the second elongate member bears against the bottom wall of said box.

The joint is then heat treated in any suitable manner. One suitable heat treatment includes heating the joint for one hundred hours (100 hrs) at two hundred ten degrees Centigrade (210° C.), forty eight hours (48 hrs) at three hundred forty degrees Centigrade (340° C.), and sixty hours (60 hrs) at six hundred twenty five degrees Centigrade (625° C.) with a fifty degree Centigrade/h (50° C./hr) ramp rate for all steps. The invention is not restricted to this particular heat treatment.

A primary object of this invention is to provide a more robust CICC joint than heretofore available.

A more particular object is to provide the more robust joint without requiring the use of solder.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

The novel structure includes a solderless joint for the 35-T SCH. The joint is tested using 45-T coil-A cable. The configuration provides a long term worry free vacuum tightness and voids the bond between thermal mismatch materials like copper and stainless steel, which may lead to joint deformation during heat treatment. A quantitative comparison of the current transient with the novel solder filled praying-hands joint is also disclosed.

The novel design of the CICC joint is efficient, robust and well balanced between DC resistance and AC losses.

Figure 1:
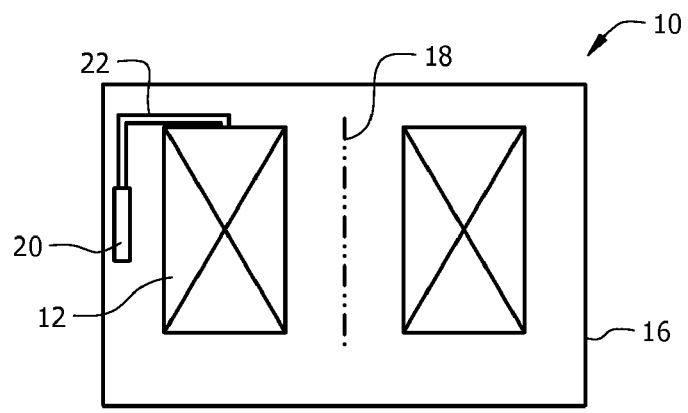
FIG. 1 is a cross-sectional view of a magnetic vessel having an outsert therein.

Referring now to FIG. 1, it will there be seen that the environment of the invention as a whole is denoted by the reference numeral 10.

Superconducting outsert 12 includes three concentric layer-wound subcoils using different grades of $Nb_3Sn$ cable-in-conduit-conductors. Outsert 12 is a right circular cylinder similar to a bundt cake with sharp corners and perfectly round inner and outer sides. FIG. 1 is a cross-section through the middle of the thick-walled cylinder. The splices and terminals of the subcoils are designed to be placed outside the 35-T SCH (approximately three quarters of a meter (0.75 m) in radius) and aligned with a magnetic axial field.

More particularly, outsert 12 having centerline 18 is positioned inside magnetic vessel 16.

Superconducting cable 22 provides electrical communication between outsert 12 and novel joint box 20. Cable 24 is directly below and concealed by cable 22 in this plan view.

Figure 2:
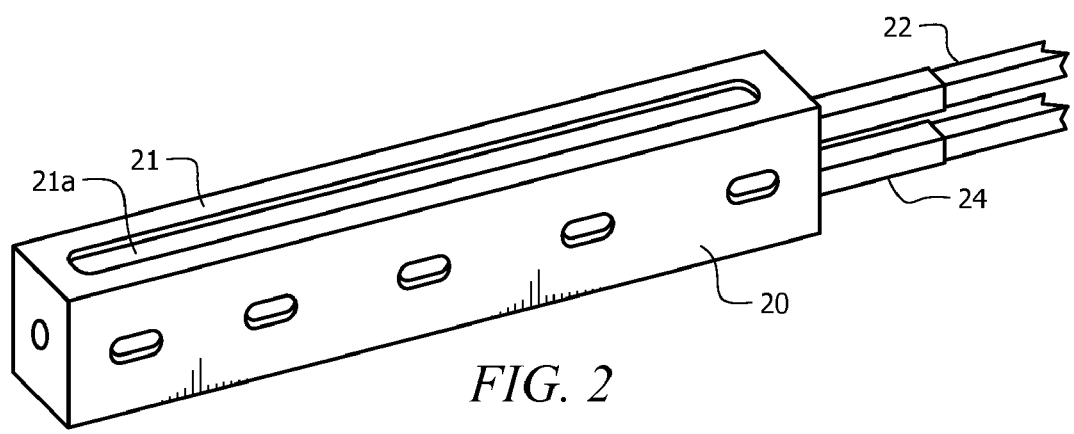
FIG. 2 is perspective view of the novel CICC joint.

FIG. 2 is a perspective view that depicts cables 22 and 24 entering joint box 20. Joint box 20 has a lid 21 with elongate slot 21a formed in it as depicted and an open end so that cables 22, 24 may be extended into the hollow interior thereof.

Figure 3:
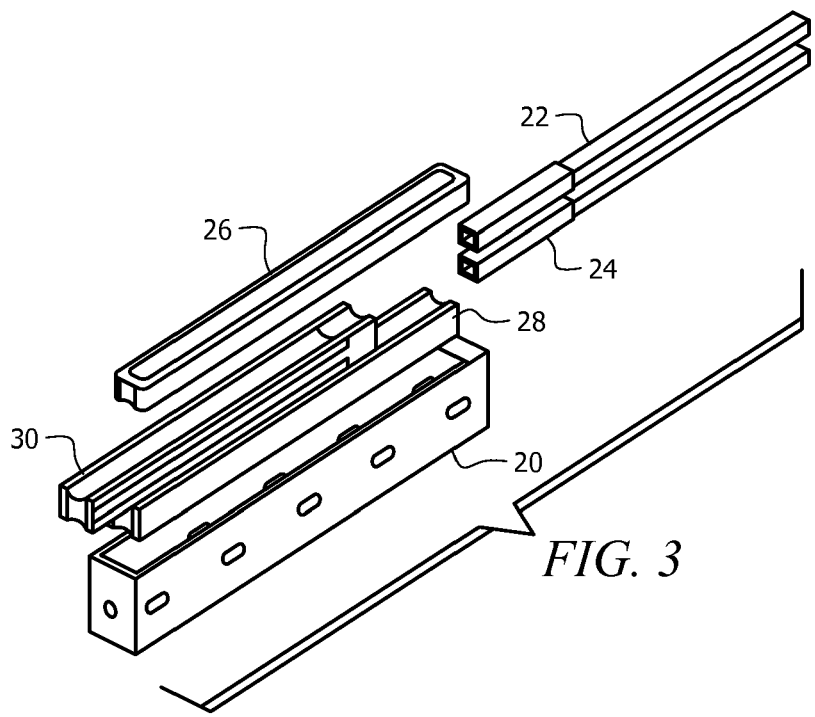
FIG. 3 is an exploded view of the CICC joint.
Figure 6:
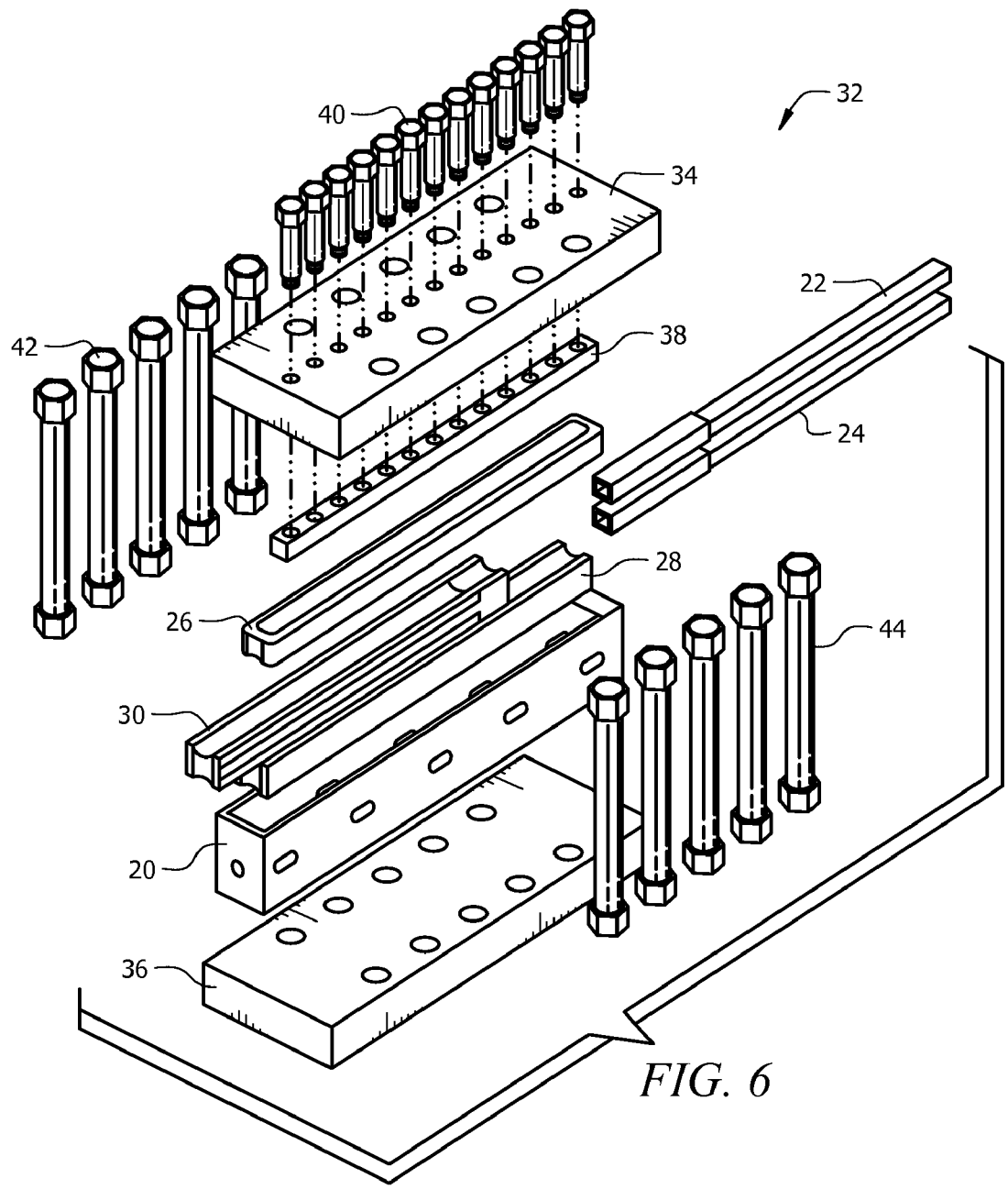
FIG. 6 is an exploded perspective view of the CICC joint and compression tool.

Instead of lid 21 having slot 21a formed therein, joint box 20 could also have an open top as depicted in FIGS. 3 and 6.

FIG. 3 is an exploded perspective view depicting joint box 20, cables 22, 24, and three elongate members 26, 28, and 30 that cooperate to separate cables 22 and 24 from one another and to allow said cables to be tightly compressed within joint box 20.

Figure 4:
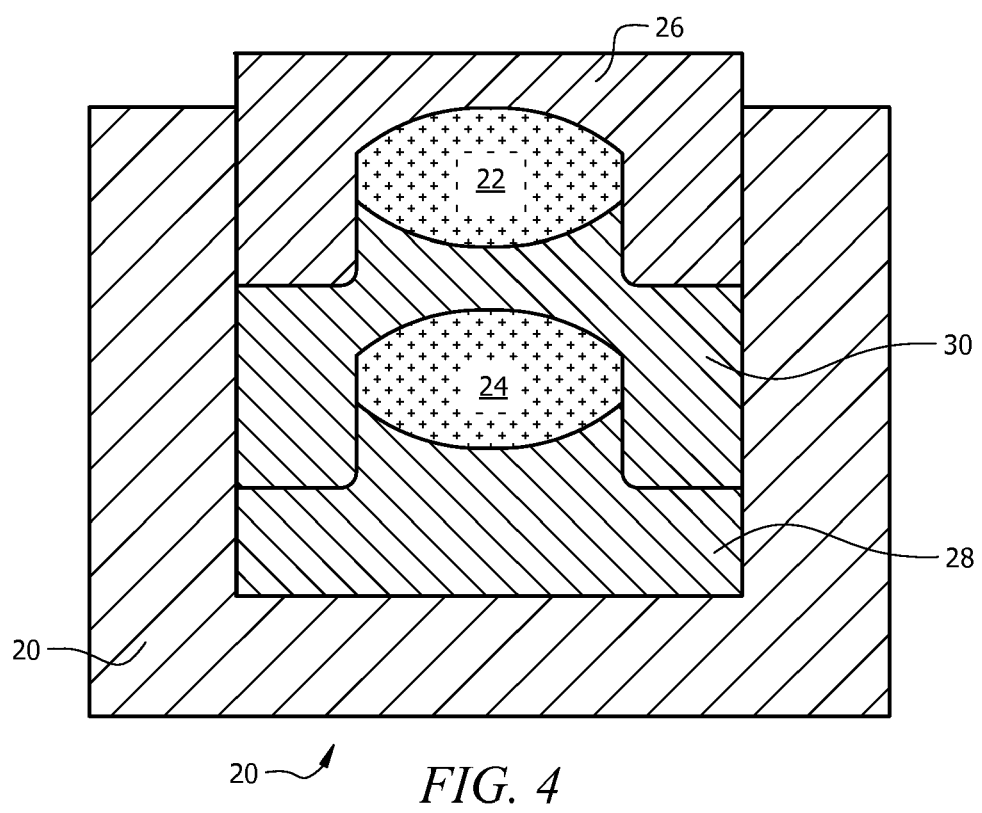
FIG. 4 is a cross-sectional view of the CICC joint.

As better understood in the transverse cross-sectional view of FIG. 4, which depicts "U"-shaped CICC joint box 20 and its contents after heat treatment, the three elongate members include inverted "U"-shaped elongate member 26, inverted "T"-shaped elongate member 28, and middle elongate member 30 of irregular shape. Middle member 30 is formed of copper and is sandwiched between cables 22, 24. It is referred to hereinafter as the elongate copper member. Elongate member 26 overlies cable 22, elongate member 28 underlies cable 24, and elongate member 28 overlies the bottom wall of joint box 20.

The shape of members 26, 28, and 30 in FIG. 4 do not exactly match the shapes depicted in FIGS. 3 and 6. However, the detailed shapes of the elongate hardware are customized to the particular superconducting cable being joined. Accordingly, the shapes depicted in the Figs. are examples of shapes that are used to form the novel joint and the invention is not limited to any particular shape.

Cable 22 is captured between a concavity or elliptical surface formed in the bight of elongate member 26 and a first concavity or elliptical surface formed mid-length of elongate copper member 30.

Cable 24 is captured between a concavity or elliptical surface formed mid-length of elongate member 28 and a second concavity or elliptical surface formed mid-length of elongate copper member 30.

Figure 5:
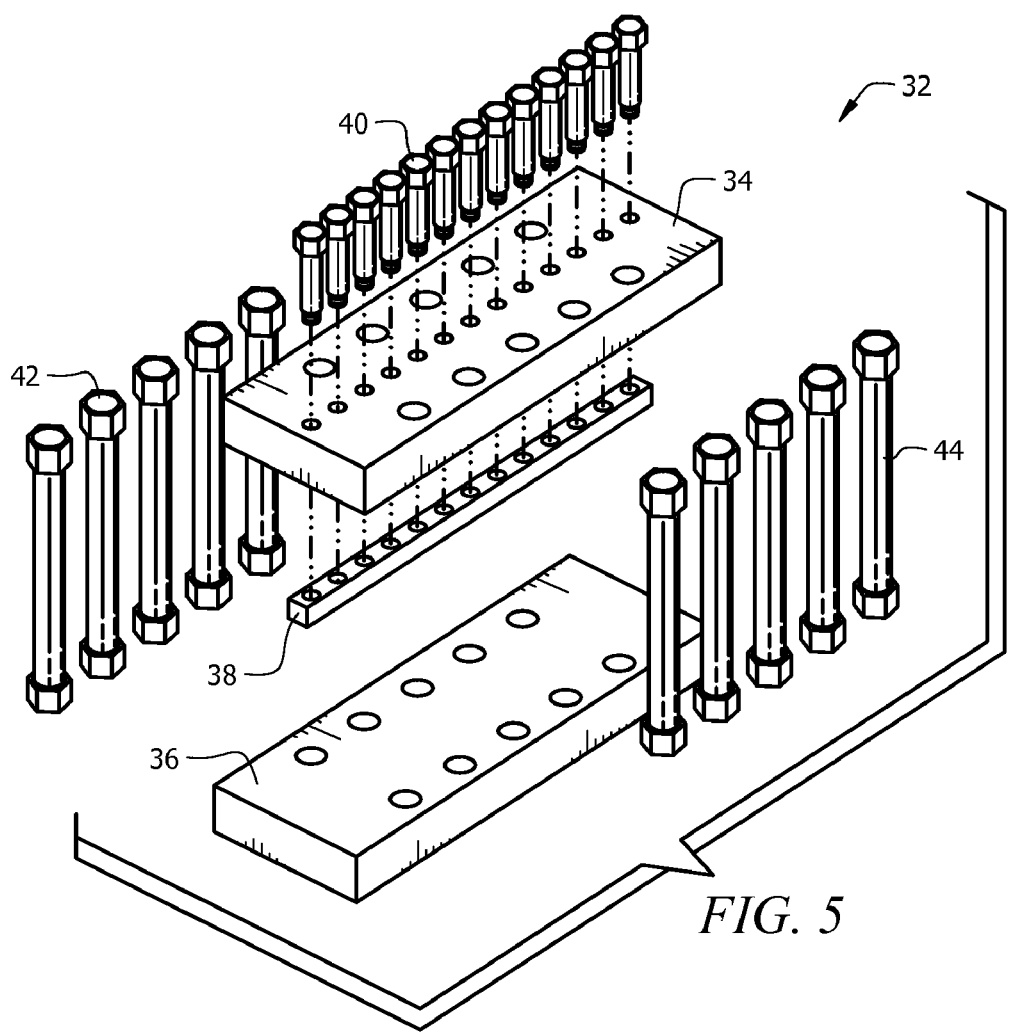
FIG. 5 is an exploded perspective view of the compression tool.

Superconducting cables 22 and 24 are compressed in joint box 20 against OFHC copper member 30 between said elongate members 26 and 28 by compression tool 32 depicted in FIGS. 5 and 6. The final void fraction is designed to be twenty percent (20%). Strands 22, 24 and elongate copper member 30 are sintered together during the heat treatment, which provides a good current transfer without bearing a large penalty in AC losses. This eliminates the need for solder filling and other post-heat treatment processing, which reduces the risk of damage to the expensive superconductors in the brittle state. Two cooling channels (not depicted) may be machined on both sides of elongate copper member 30 to enhance the cooling inside joint box 20 but such machining is optional.

Each superconducting cable 22, 24 is prepared by removing its conduit jacket to expose a predetermined length of cable. The stainless foil is removed and a steel wire is wrapped around each cable approximately every twenty five millimeters (25 mm) to prevent untwisting.

The chrome plate on the strands is removed by chemical etching, preferably with a 37% HCL solution. The process is not applied to the current joint because 45-T A cable strands are not chrome plated.

The cables are cleaned with isopropyl alcohol.

The joint parts and cables are assembled together as depicted in FIG. 4.

Joint box 20 and its contents are then placed into sandwiched relation to compress tooling 32 as depicted in FIG. 6. As depicted in FIGS. 5 and 6, tool 32 includes flat top plate 34, flat bottom plate 36, base member 38 that underlies and forms a part of flat top plate 34, a plurality of center bolts 40, a first plurality of elongate bolts 42 and a second plurality of elongate bolts 44. The top plate, bottom plate, and base member are suitably apertured as depicted to receive their respective bolts.

Cables 22, 24 are compressed inside joint box 20 by tightening center bolts 40 in the center line of top plate 34 into base member 38 in conjunction with tightening of elongate bolts 42, 44. A torque wrench is used to achieve equal pressure along the extent of joint box 20.

More particularly, when flat top plate 34 and flat bottom plate 36 are driven toward one another by the tightening of elongate bolts 42, 44, base member 38 extends through slot 21*a* formed in lid 21 of joint box 20 and bears against elongate member 26 which bears against cable 22, which bears against elongate copper member 30, which bears against cable 24, which bears against elongate member 28, which bears against the bottom wall of joint box 20, which bears against flat bottom plate 36.

Lid 21 of joint box 20 is spot-welded at several places after final voids are achieved, and the entire lid is TIG welded to seal the joint box.

The joint is then heat treated. An exemplary heat treatment includes heating the joint for one hundred hours (100 hrs) at two hundred ten degrees Centigrade (210° C.), forty eight hours (48 hrs) at three hundred forty degrees Centigrade (340° C.), and sixty hours (60 hrs) at six hundred twenty five degrees Centigrade (625° C.) with a fifty degrees Centigrade per hour (50° C./hr) ramp rate for all steps. The invention is not limited to this particular heat treatment, i.e., similar heat treatments required for Nb3Sn superconductors are within the scope of this invention.

CICC joint box 20 was immersed in saturated He I bath at 4.2 K during an experiment. The current was supplied by a 20 kA DC power supply through vapor cooled current leads. Two different methods have been used to measure the joint resistance. First, joint resistance is obtained by measuring the voltage drop across joint $V_1$, in steady state with known transport current values. Joint resistance can also be obtained by measuring the current diffusion in the joints during ramping. The transient current distribution in the joint along the longitudinal direction z can be written as:

$$\frac{\partial^2 I}{\partial z^2} = \frac{L/Z_0}{RZ_0}\frac{\partial I}{\partial t} = \frac{\tau_0}{Z_0^2}\frac{\partial I}{\partial t} \qquad \text{Eq. 1}$$

where L is the inductance of the joint, R is the resistance of the joint, $Z_0$ is the total current transfer length, and $\tau_0 = L/R$. By assuming homogenous current distribution within the cable, the specific inductance $L/Z_0$ is expressed as:

$$\frac{L}{Z_0} = \frac{\mu_0}{\pi}\left[\ln\left(\frac{a}{d/2 - \sqrt{d^2/4 - a^2}}\right) + \frac{1}{4}\right] \qquad \text{Eq. 2}$$

where α is the radius of the cable and d is the distance between the two cable centers. For the current joint geometry, this gives L≈0.15 μH. Therefore, the diffusion time will be on the order of $10^2$ seconds according to the expected nano-Ohm joint resistance and quite sensitive to its actual value.

To capture the current transient along the joint length, two Hall sensors are placed at one third and two thirds of the lapping length respectively. The sensing elements are centered transversely over the copper section between the cables so that they are in the best orientation to measure the self field generated by the transport current.

Figure 7:
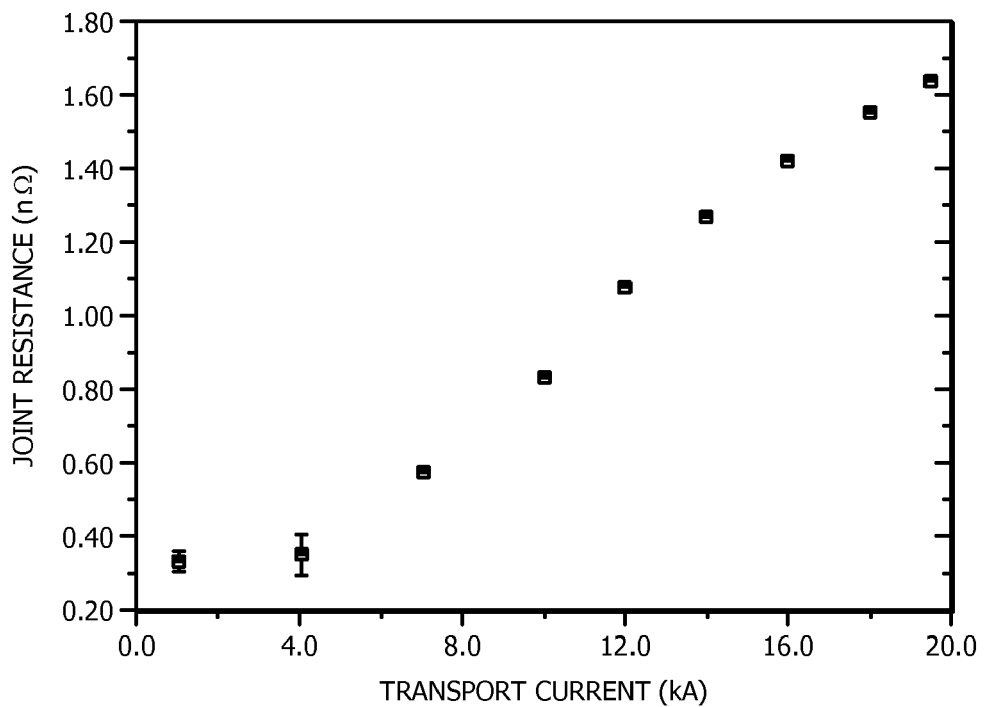
FIG. 7 is a graph of the measured joint resistance of FSJ-A as a function of the transport current.

The joint resistance obtained by the voltage measurement is generally less than 1.7 nΩ with a transport current up to 19.5 kA as shown in FIG. 7. The joint resistance shows a quite strong dependence on the transport current. This current dependency can not be explained by the magneto-resistivity raise of the copper in the joint from the increased self-field, which would explain only about 0.05 nΩ from 0 to 19.5 kA.

Figure 8:
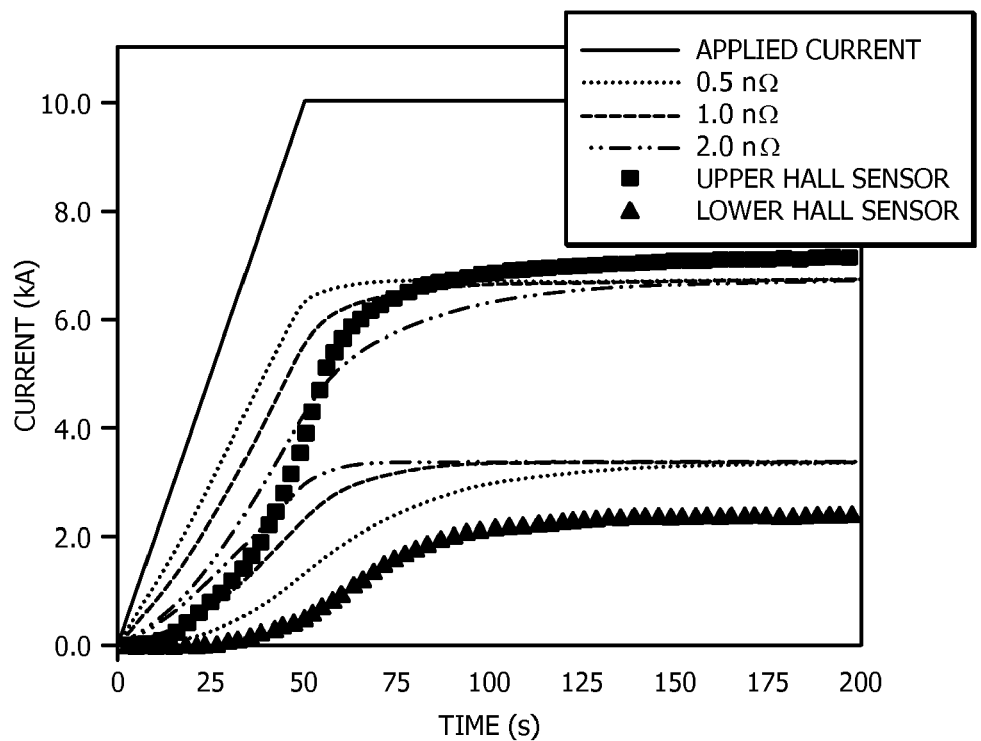
FIG. 8 is a graph of the current variation as a function of time at two different locations along the FSJ-A sample joint for the case of a linear ramp at 200 A/s and hold steady at 10 kA afterwards.

FIG. 8 depicts the current measurements by Hall sensors for a linear 200 A/s ramp to 10 kA followed by a hold for four hundred seconds (400 s) to allow the current diffusion in the joint to reach equilibrium state. The solid circles and solid triangles are the measurements obtained from the upper and lower Hall sensors, respectively. The dash, dot and short dash dot lines are the calculations using (1) for different joint resistance R with the boundary conditions that $I|_{z=0}=I(t)$ and $I|_{z=Z_0}=0$. In this case, (1) has an analytic solution, which can be expressed as:

$$I(z,\tau) = \frac{I_{max}}{\tau_1}\left(\left(1 - \frac{z}{Z_0}\right)\tau - \frac{2Z_0^2}{\pi^3}\sum_{n=1}^{\infty}\sin\left(\frac{n\pi z}{Z_0}\right)\frac{1 - e^{\frac{-n^2\pi^2\tau}{Z_0^2}}}{n^3}\right)(t < t_1), \qquad \text{Eq. 3}$$

$$I(z,\tau) = I_{max}\left[\left(1 - \frac{z}{Z_0}\right) - \frac{2}{\pi}\left(1 - \frac{\tau_1}{\tau_o}\right)\sum_{n=1}^{\infty}\sin\left(\frac{n\pi z}{Z_0}\right)e^{\frac{-n^2\pi^2(\tau-\tau_1)}{Z_0^2}}\right]$$

$$-\frac{I_{max}}{\tau_o}\frac{2Z_0^2}{\pi^3}\sum_{n=1}^{\infty}\frac{1}{n^3}\sin\left(\frac{n\pi z}{Z_0}\right)\left[e^{\frac{-n^2\pi^2(\tau-\tau_1)}{Z_0^2}} - e^{\frac{-n^2\pi^2\tau}{Z_0^2}}\right](t > t_1),$$

where $t_1$ is the ramping time, $\tau = t/\tau_0$ and $\tau_1 = t_1/\tau_0$. The result shows that at 10 kA the current transferring through the lower portion of elongate copper member 30 is much lower than the predicted linear distribution in the calculation. However, by comparing the actual diffusion time with the calculation, the joint resistance is projected to be between 0.5 nΩ and 1 nΩ, which is in good agreement with the DC voltage measurements.

Figure 9:
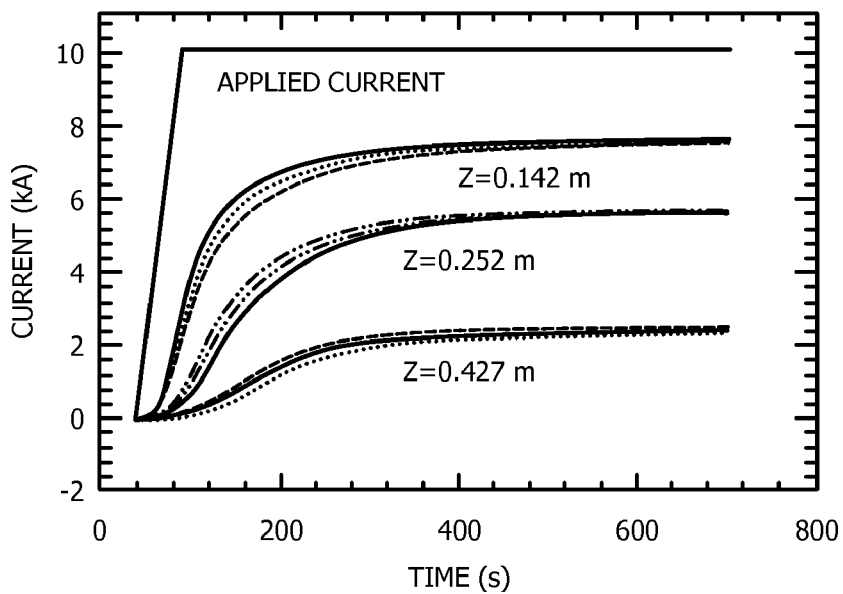
FIG. 9 is a graph of current variation as a function of time at three different locations along the 45-T solder-filled praying-hands joint for the case of a linear ramp at 200 A/s and hold steady at 10 kA afterwards.

FIG. 9 depicts similar measurements performed for the praying-hands solder-filled joint using the same 45-T coil-A cable. The current is linearly distributed along the 0.56 m length in this case, which indicates that the current is equally transferred along the lapping length for the solder-filled joint. The uneven current distribution may be caused by the relatively high contact resistance in the joint.

The dotted lines in FIG. 9 represent calculations using Equation (3) with three different joint resistances: 0.38 nΩ, 0.32 nΩ and 0.27 nΩ respectively. The lapping length of joint Z0 is 0.56 m, the cable radius α is 7.1 mm, and the distance between the cable d is 22.6 mm.

Figure 10:
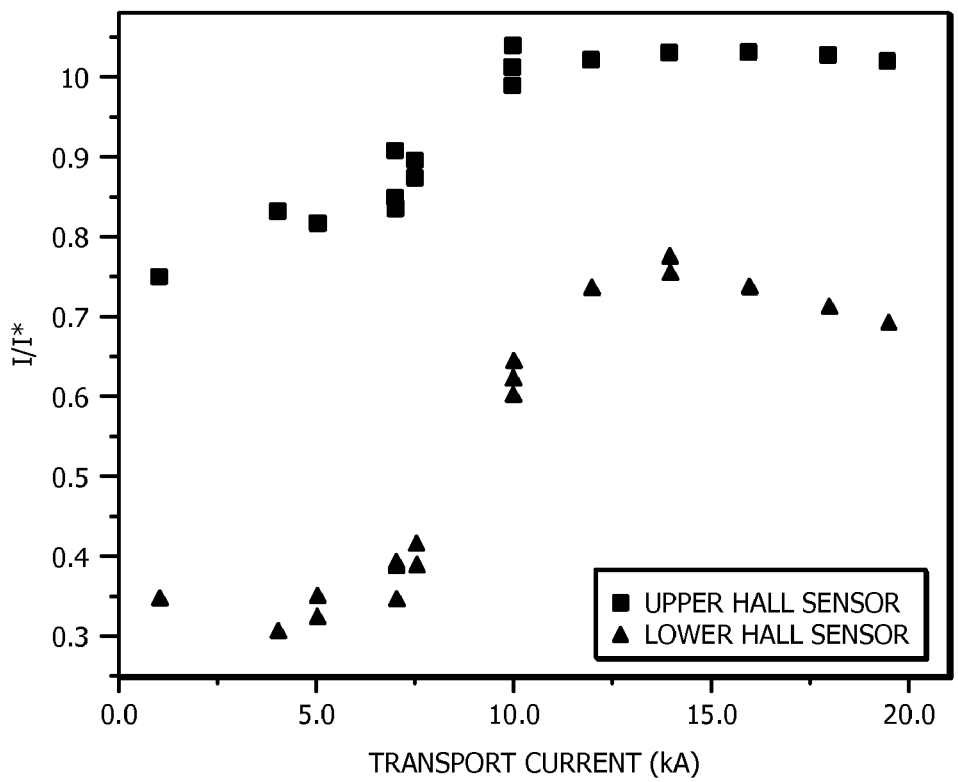
FIG. 10 is a graph that indicates current distribution along the joint length as a function of the transport current where I* is a calculated value for the steady state using (3) and I is the measured steady state value.

FIG. 10 depicts the dimensionless current distribution along the solderless joint against the total transport current $I_{max}$. The portion of the total current transferred by the lower part of the joint increases with the transport current up to 12 kA. Voltage is the driving force of this change in current distribution as indicated by a strong current dependent joint resistance in voltage measurements. With current increase, more and more inner strands begin to carry current as the outer strands become saturated in the joint self-field. The relative higher contact resistances between strands contribute to the voltage drop increase in addition to the resistance of elongate copper member 30 between cables 22 and 24. Improving the sintering between the strands helps to reduce this effect.

The advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. A cable-in-conduit-conductor (CICC) joint for use with a hybrid magnet, comprising:
   a first cable and a second cable disposed in substantially parallel, spaced apart relation to one another;
   an elongate copper member disposed in sandwiched relation between said first cable and said second cable;
   a first elongate member disposed in overlying relation to said first cable;
   a second elongate member disposed in underlying relation to said second cable;
   a joint box having side walls, an open top, a bottom wall, an open end, and a hollow interior;
   each of said first and second cables having a free end disposed within a hollow interior of said joint box, entering said hollow interior through said open end;
   a first flat plate disposed in closing relation to said open top of said joint box;
   an elongate base member disposed in underlying relation to said first flat plate in registration with a longitudinal axis of symmetry of said first flat plate so that said elongate base member extends into said hollow interior of said joint box when said first flat plate is positioned into overlying relation to said open top of said joint box; and
   compressing means for driving said first flat plate toward said bottom wall of said joint box so that said elongate base member bears against said first elongate member, said first elongate member bears against said first elongate cable, said first elongate cable bears against said elongate copper member, said elongate copper member bears against said second elongate cable, said second elongate cable bears against said second elongate member, and said second elongate member bears against said bottom wall of said joint box.

2. The joint of claim 1, further comprising:
   said compressing means including said first flat plate and a second flat plate that are interconnected to one another by a plurality of elongate bolts;
   said second flat plate underlying said bottom wall of said joint box.

3. A cable-in-conduit-conductor (CICC) joint for use with a hybrid magnet, comprising:
   a first cable and a second cable disposed in substantially parallel, spaced apart relation to one another;
   an elongate copper member disposed in sandwiched relation between said first cable and said second cable;
   a first elongate member disposed in overlying relation to said first cable;
   a second elongate member disposed in underlying relation to said second cable;
   a joint box having side walls, a top wall, a bottom wall, an open end, and a hollow interior;
   an elongate slot formed in said top wall;
   said first elongate member, said first cable, said elongate copper member, said second cable, and said second elongate member being disposed within said hollow interior of said joint box, entering said hollow interior through said open end;
   a first flat plate having an elongate base member disposed in underlying relation to said first flat plate in registration with a longitudinal axis of symmetry of said first flat plate so that said elongate base member extends into said hollow interior of said joint box through said slot formed in said top wall of said joint box when said first flat plate is positioned into overlying relation to said top wall of said joint box; and
   compressing means for driving said first flat plate toward said bottom wall of said joint box so that said elongate base member bears against said first elongate member, said first elongate member bears against said first elongate cable, said first elongate cable bears against said elongate copper member, said elongate copper member bears against said second elongate cable, said second elongate cable bears against said second elongate member, and said second elongate member bears against said bottom wall of said joint box.

4. The joint of claim 3, further comprising:
   said compressing means including said first flat plate and a second flat plate that are interconnected to one another by a plurality of elongate bolts;
   said second flat plate underlying said bottom wall of said joint box.

5. A method of fabricating a cable-in-conduit-conductor (CICC) joint for use with a hybrid magnet, comprising the steps of:
   positioning a first cable and a second cable in substantially parallel, spaced apart relation to one another;
   positioning an elongate copper member in sandwiched relation between said first cable and said second cable;
   positioning a first elongate member in overlying relation to said first cable;
   positioning a second elongate member in underlying relation to said second cable;
   providing a joint box having an open top, a bottom wall, an open end, and a hollow interior;
   positioning said first elongate member, said first cable, said elongate copper member, and said second elongate member within a hollow interior of said joint box, through said open end;
   positioning a first flat plate in closing relation to said open top of said joint box;
   positioning an elongate base member in underlying relation to said first flat plate in registration with a longitudinal axis of symmetry of said first flat plate so that said elongate base member extends into said hollow interior of said joint box when said first flat plate is positioned into overlying relation to said open top of said joint box;
   driving said first flat plate toward said bottom wall of said joint box so that said elongate base member bears against said first elongate member, said first elongate member bears against said first elongate cable, said first elongate cable bears against said elongate copper member, said elongate copper member bears against said second elongate cable, said second elongate cable bears against said second elongate member, and said second elongate member bears against said bottom wall of said joint box; and
   heat treating said joint.

6. The method of claim 5, further comprising the steps of:
heating the joint for one hundred hours (100 hrs) at two hundred ten degrees Centrigrade (210° C.), forty eight hours (48 hrs) at three hundred forty degrees Centigrade (340° C.), and sixty hours (60 hrs) at six hundred twenty five degrees Centigrade (625° C.) with a fifty degree Centigrade/h (50° C./hr) ramp rate for all steps.

* * * * *